(12) United States Patent
Kobayashi et al.

(10) Patent No.: US 7,173,556 B2
(45) Date of Patent: Feb. 6, 2007

(54) AMPLIFIER CIRCUIT AND ANALOG-TO-DIGITAL CIRCUIT USING THE SAME

(75) Inventors: Shigeto Kobayashi, Gifu (JP); Atsushi Wada, Ogaki (JP); Kuniyuki Tani, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/073,720

(22) Filed: Mar. 8, 2005

(65) Prior Publication Data
US 2005/0219111 A1   Oct. 6, 2005

(30) Foreign Application Priority Data
Mar. 24, 2004   (JP) ............... 2004-087922

(51) Int. Cl.
*H03M 1/38* (2006.01)
(52) U.S. Cl. .................. 341/161; 341/172; 341/155
(58) Field of Classification Search ........ 341/118, 341/120, 155, 161, 172, 122, 143
See application file for complete search history.

(56) References Cited

U.S. PATENT DOCUMENTS

| | | | | |
|---|---|---|---|---|
| 5,416,485 A | * | 5/1995 | Lee | 341/172 |
| 6,195,032 B1 | * | 2/2001 | Watson et al. | 341/162 |
| 6,320,530 B1 | * | 11/2001 | Horie | 341/163 |
| 6,366,230 B1 | * | 4/2002 | Zhang et al. | 341/162 |
| 6,617,992 B2 | * | 9/2003 | Sakurai | 341/161 |
| 6,642,871 B2 | * | 11/2003 | Takeyabu et al. | 341/120 |
| 6,784,824 B1 | * | 8/2004 | Quinn | 341/172 |
| 7,009,549 B1 | * | 3/2006 | Corsi | 341/161 |
| 2005/0140537 A1 | * | 6/2005 | Waltari | 341/162 |

FOREIGN PATENT DOCUMENTS

JP      4-026229      1/1992

* cited by examiner

*Primary Examiner*—Linh V. Nguyen
(74) *Attorney, Agent, or Firm*—McDermott Will & Emery LLP

(57) ABSTRACT

One or more input capacitors are connected to an inverting input terminal of an operational amplifier. Connected to the respective input capacitors are switches for on-off control of the input of an input signal, switches for on-off control of the input of another input signal, switches for on-off control of the input of a higher reference voltage and switches for on-off control of the input of a lower reference voltage. The switches for on-off control of the input of an input signal and the switches for on-off control of the input of another input signal are controlled by independent control signals.

16 Claims, 8 Drawing Sheets

AMPLIFIER CIRCUIT AND ANALOG-TO-DIGITAL CIRCUIT USING THE SAME

BACKGROUND OF THE INVENTION

1. Field of the Invention

The present invention generally relates to an amplifier circuit and an analog-to-digital converter using the same, and it particularly relates to an amplifier circuit which inputs selectively a plurality of analog signals via a switch or switches and an analog-to-digital converter utilizing the amplifier circuit.

2. Description of the Related Art

In recent years, systems employing a switched-capacitor type amplifier circuit, including analog-to-digital digital converters (hereinafter referred to as "AD converter") using a switched-capacitor type amplifier circuit, are often used in mobile devices such as cellular phones. And those mobile devices are provided with an increasing variety of added functions, such as image shooting function, image playback function, moving image shooing function and moving image playback function. Along with this trend, there is a growing demand for high-speed operation of those switched-capacitor type amplifier circuits.

On the other hand, there is also demand for smaller sizes of AD converters. One known related art to meet such a demand is an AD converter which comes with a cyclic stage capable of feeding the output of its own stage back to the input thereof (see Reference (1) in the following Related Art List, for instance).

Related Art List (1) Japanese Patent Application Laid-Open No. Hei4-26229.

In FIG. 1 of the above-mentioned Reference (1), it is assumed that a subtracter circuit SUB1 having an amplifying function in the preceding stage receives an input selectively from a sample-and-hold circuit S/H1 and a DA converter DA2 through a switch (not shown). A subtracter circuit SUB2 having an amplifying function in the subsequent stage is also assumed to operate the same way. A sample-and-hold circuit S/H2 in the subsequent stage receives an input selectively from the preceding stage and from a sample-and-hold circuit S/H4 in its own stage through a switch SW1. Such a switch, which presents a large resistance component, increases the time constant of the circuit as a whole and causes delays in signal output.

SUMMARY OF THE INVENTION

The present invention has been made in view of the aforementioned circumstances and an objective thereof is to realize a high-speed operation for an amplifier circuit to which a plurality of analog signals are inputted selectively through switches and for an AD converter utilizing the same.

A preferred embodiment according to the present invention relates to an amplifier circuit. This amplifier circuit is of a capacitive coupling type in which any of a plurality of input signals is inputted to one end of capacitance and a voltage appearing on the other end thereof is sampled, and the amplifier circuit includes: a plurality of switches for use with input signals, provided respectively at path through which the plurality of input signals lead to one end of the capacitance; and a switch for use with reference, provided at path through which a predetermined reference voltage signal leads to one end of the capacitance, wherein each of the switches for use with input signals is directly connected to one end of the capacitance.

It is to be noted that any arbitrary combination of the above-described structural components and expressions mutually replaced by among a method, an apparatus, a system and so forth are all effective as and encompassed by the present embodiments.

DETAILED DESCRIPTION OF THE INVENTION

Figure 1:
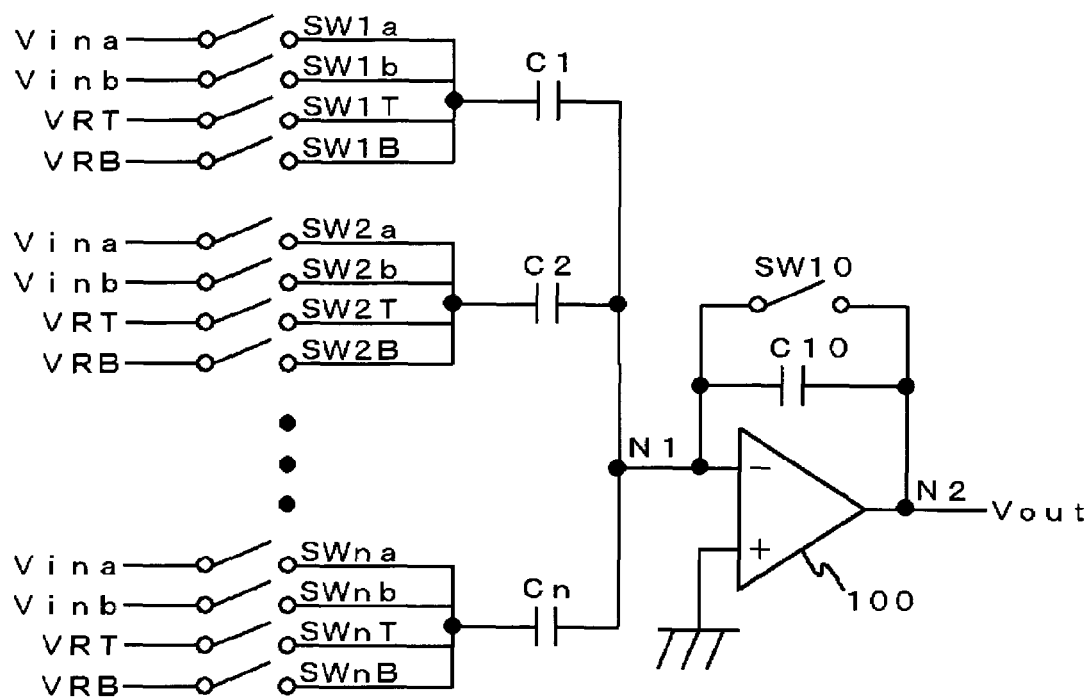
FIG. 1 illustrates an amplifier circuit of a single-ended switched-capacitor type according to a first embodiment of the present invention.

The invention will now be described based on the following embodiments which do not intend to limit the scope of the present invention but exemplify the invention. All of the features and the combinations thereof described in the embodiments are not necessarily essential to the invention.

Some embodiments which typically represent the present invention will first be described.

A preferred embodiment according to the present invention relates to an amplifier circuit of a capacitive coupling type in which any of a plurality of input signals is inputted to one end of capacitance and a voltage appearing on the other end thereof is sampled, and the amplifier circuit includes: a plurality of switches for use with input signals, provided respectively at path through which the plurality of input signals lead to one end of the capacitance; and a switch for use with reference, provided at path through which a predetermined reference voltage signal leads to one end of the capacitance, wherein each of the switches for use with input signals is directly connected to one end of the capacitance.

By employing this embodiment, each input signal is sampled into the capacitance, via a switch for use with input signals, without ever using a switch that switches between an input and a reference. Thus, the time constant of a lowpass filter formed by the resistance component of the switch for use with input signals and said capacitance is reduced. As a result, the delay of signals inputted to said capacitance can be reduced. The "capacitance" may be such that a plurality of capacitors are connected in parallel. The "predetermined reference voltage signal" includes a reference voltage signal which is to be inputted during an amplification period. "Directly connected to one end of the capacitance" means that each is connected in one stage.

Each of the plurality of switches for use with input signals may be controlled by each independent control signal. With this scheme, the inputting of each input signal and reference voltage to the capacitance is selectively carried out without the use of a switch that switches between an input and a reference.

Another preferred embodiment according to the present invention relates to an analog-to-digital converter. This analog-to-digital converter includes: an AD converter circuit which converts an input analog signal to a digital value of a predetermined bit number; a first amplifier circuit which samples the input analog signal and amplifies the sampled signal by a first predetermined gain; and a second amplifier circuit which amplifies, by a second predetermined gain, a difference between an analog signal outputted from the first amplifier circuit and an analog signal corresponding to the digital value amplified by a gain practically identical to the first predetermined gain, and which feeds the amplified difference back to the AD converter and the first amplifier circuit, wherein the amplifier circuit described in the above preferred embodiment is used as the first amplifier circuit.

By employing a structure according to this embodiment, the delay of signals inputted to the first amplifier circuit can be reduced. Thus, the second amplifier circuit can be operated at high speed, so that the high speed of an AD converter as a whole can be achieved. The "predetermined gain" includes the amplification by a factor of 1. The "first amplifier circuit" includes the amplification by a factor of 1, namely, a sample-and-hold circuit.

There may be provided an analog-to-digital circuit in which an analog signal is converted to a digital signal in a plurality of stages, wherein it is preferable that an analog signal from a preceding stage in the plurality of stages and an analog signal from the second amplifier circuit be selectively inputted to the AD converter circuit and the first amplifier circuit. The amplifier circuits described in the above another preferred embodiment is applicable to amplifier circuits that receive the input from a preceding stage of an AD converter having a plurality of stages and the feedback input of own stage. When the delay caused in signal input of the amplifier circuits is reduced, the high speed of an AD converter as a whole can be achieved.

Still another preferred embodiment according to the present invention relates also to an analog-to-digital converter. This analog-to-digital converter converts an input analog signal to a digital signal in such a manner that the input analog signal is circulated a plurality of times, and the analog-to-digital converter includes: an AD converter circuit which converts the input analog signal to a digital value of a predetermined bit number; a first amplifier circuit which samples the input analog signal and amplifies the sampled signal by a first predetermined gain; and a second amplifier circuit which amplifies, by a second predetermined gain, a difference between an analog signal outputted from the first amplifier circuit and an analog signal corresponding to the digital value amplified by a gain practically identical to the first predetermined gain, wherein any of an plurality of the input analog signals is inputted to the AD converter circuit and the first amplifier circuit, and wherein the amplifier circuit described in the above preferred embodiment is used as the first amplifier circuit. An analog signal outputted from the second amplifier circuit may be further inputted to the AD converter circuit and the first amplifier circuit.

The amplifier circuits described in the above still another preferred embodiment is applicable to amplifier circuits that receives a plurality of inputs from the preceding stage or the input of three or more systems by a feedback of its own stage. When the delay in signal input of the amplifier circuits is reduced, the high speed of an AD converter as a whole can be achieved. It is to be noted here that the "predetermined gain" includes the amplification by a factor of 1. The "first amplifier circuit" includes the amplification by a factor of 1, namely, a sample-and-hold circuit.

Still another preferred embodiment according to the present invention relates also an analog-to-digital converter. This analog-to-digital converter converts an analog signal to a digital signal in a plurality of stages, and a certain stage of the analog-to-digital converter includes: a shared DA converter circuit which selectively converts a converted digital value of own stage or that of another stage to an analog signal; and a shared subtracter-amplifier circuit which selectively performs subtraction between two subtractions where one subtraction is such that an output signal of the shared DA converter circuit is subtracted from the input analog signal of the own stage or an analog signal obtained after amplifying the input analog signal of the own stage by a predetermined gain and the other subtraction is such that an output signal of the shared DA converter circuit that has converted a converted digital value of the another stage is subtracted from the input analog signal of the another stage or an analog signal obtained after amplifying the input analog signal of the another stage by a predetermined gain, and which amplifiers a subtraction result by a predetermined gain, wherein the amplifier circuit described in the above preferred embodiment is used as the shared subtracter-amplifier circuit and wherein the output signal of the shared DA converter circuit is inputted as the reference voltage signal.

The amplifier circuit described in the above still another preferred embodiment is applicable to differential subtracter-amplifier circuit that receives the input of a preceding stage of an AD converter having a plurality of stages or the feedback input of own stage, subtracts the output from the DA converter circuit and amplifies the difference. As a result, the delay in signal input of the amplifier circuit is reduced, so that the high speed of an AD converter as a whole can be achieved. Furthermore, since the DA converter circuit and the subtracter-amplifier circuit can each be put to a common use in the plurality of stages, the reduction of circuit area can also be achieved.

First Embodiment

FIG. 1 illustrates an amplifier circuit of a single-ended switched-capacitor type according to a first embodiment of the present invention. Referring to FIG. 1, one or more input capacitors C1 to Cn are connected to an inverting input terminal of an operational amplifier 100. Connected to the respective input capacitors C1 to Cn are Vina switches SW1a to SWna for on-off control of the input of an input signal Vina, Vinb switches SW1b to SWnb for on-off control of the input of another input signal Vinb, VRT switches SW1T to SWnT for on-off control of the input of a higher reference voltage VRT, and VRB switches SW1B to SWnB for on-off control of the input of a lower reference voltage VRB, respectively. It is to be noted that the input signals may be provided not only in two systems but also in three or more systems. Also, the reference voltage to be used is not limited to two kinds but may be a single kind or three or more kinds.

A noninverting input terminal of the operational amplifier 100 is coupled to an autozero potential. An output terminal and the inverting input terminal of the operational amplifier

100 are coupled to each other via a feedback capacitor C10. Further connected outside theoreof is an autozero switch SW10, yielding a structure which can short the output terminal and the inverting input terminal of the operational amplifier 100.

Figure 2:
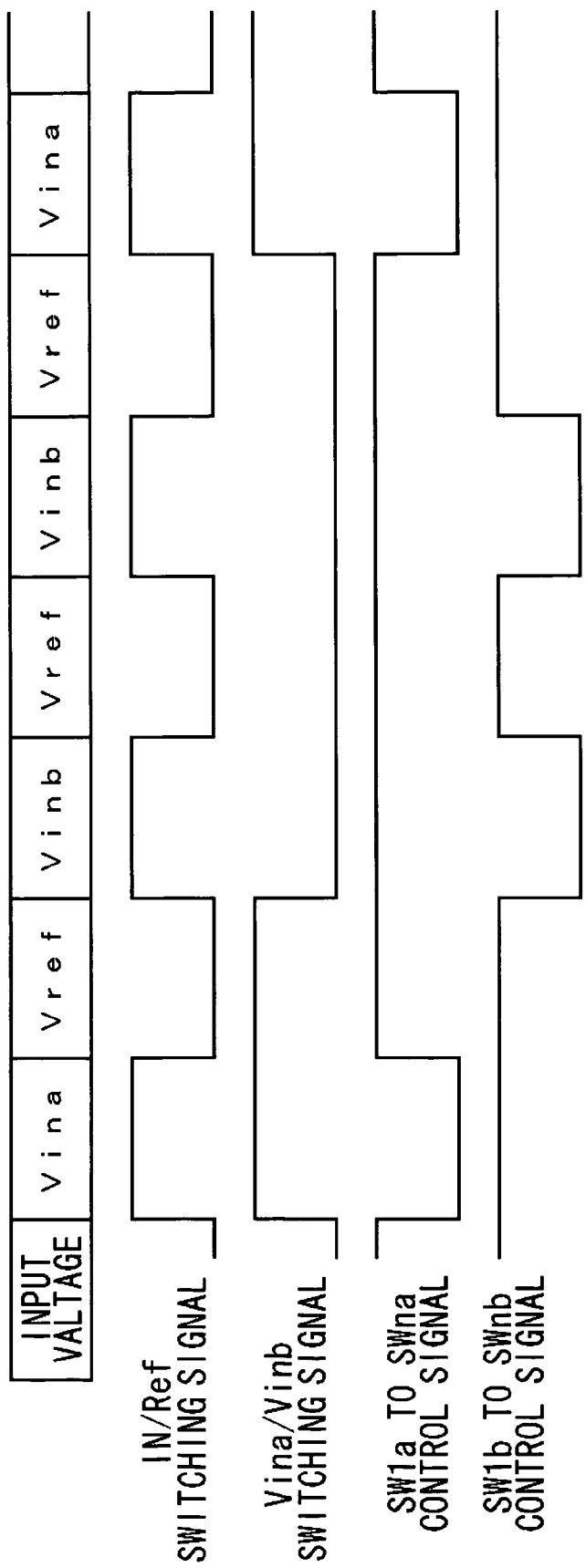
FIG. 2 is a timing chart showing the operation timing of switches according to the first embodiment.

Now referring to FIG. 2, a description is given of an operation of a single-ended switched-capacitor type amplifier circuit shown in FIG. 1. FIG. 2 is a timing chart showing the operation timing of the switches according to the first embodiment. The VRT switches SW1T to SWnT, VRB switches SW1B to SWnB and autozero switch SW10 are controlled on and off by an IN/Ref switching signal. The VRT switches SW1T to SWnT and VRB switches SW1B to SWnB turn on when the IN/Ref switching signal is low (Lo) and turn off when it is high (Hi) The autozero switch SW10 turns on when the IN/Ref switching signal is high (Hi) and turns off when it is low (Lo).

The Vina switches SW1a to SWna are controlled on and off by an SW1a to SWna control signal. The Vina switches SW1a to SWna turn on when the SW1a to SWna control signal is low (Lo) and turn off when it is high (Hi). The SW1a to SWna control signal can be generated by passing the IN/Ref switching signal and Vina/Vinb switching signal through a NAND circuit. The Vinb switches SW1b to SWnb are controlled on and off by an SW1b to SWnb control signal. The Vinb switches SW1b to SWnb turn on when the SW1b to SWnb control signal is low (Lo) and turn off when it is high (Hi). The SW1b to SWnb control signal can be generated by passing the inverting signals of the IN/Ref switching signal and Vina/Vinb switching signal through a NAND circuit.

First, the IN/Ref switching signal goes high, the SW1a to SWna control signal goes low, and the SW1b to SWnb control signal goes high, and as a result, the Vina switches SW1a to SWna turn on, the Vinb switches SW1b to SWnb turn off, the VRT switches SW1T to SWnT turn off, the VRB switches SW1B to SWnB turn off, and the autozero switch SW10 turns on. At this time, the charge QA at the input-side node N1 is given by the following equation (A1):

$$QA = C_{1-n}(Vina - Vag) \quad (A1)$$

where $C_{1-n}$ is a combined capacity value of capacitors C1 to Cn and Vag is an autozero potential of an operational amplifier 100.

Next, the IN/Ref switching signal goes low and both the SW1a to SWna control signal and the SW1b to SWnb control signal go high, and as a result, the Vina switches SW1a to SWna turn off, the Vinb switches SW1b to SWnb turn off, the VRT switches SW1T to SWnT turn on, the VRB switches SW1B to SWnB turn on, and the autozero switch SW10 turns off. At this time, the charge QB at the input-side node N1, which is virtually grounded, is given by the following equation (A2):

$$QB = C_{1-n}(Vref - Vag) + C10(Vout - Vag) \quad (A2)$$

where Vref is a reference voltage generated by at least one of a higher reference voltage VRT and a lower reference voltage VRB and C10 is a capacity value of a feedback capacitors C10.

Since the input-side node N1 has no path through which charge can escape, QA=QB according to the principle of conservation of charge and hence the following equation (A3) holds:

$$Vout = C10/C_{1-n}(Vina - Vref) + Vag \quad (A3)$$

Accordingly, provided that an autozero potential Vag is ideally a ground potential, the single-ended switched-capacitor type amplifier circuit can amplify the value derived by subtracting a reference voltage Vref from an input signal Vina, at the capacity ratio between the input capacitors C1 to Cn and the feedback capacitor C10. It goes without saying, however, that an approximate value can be obtained even when the autozero potential Vag is not a ground potential. Also, an input signal Vinb can be amplified in a similar manner.

Figure 3:
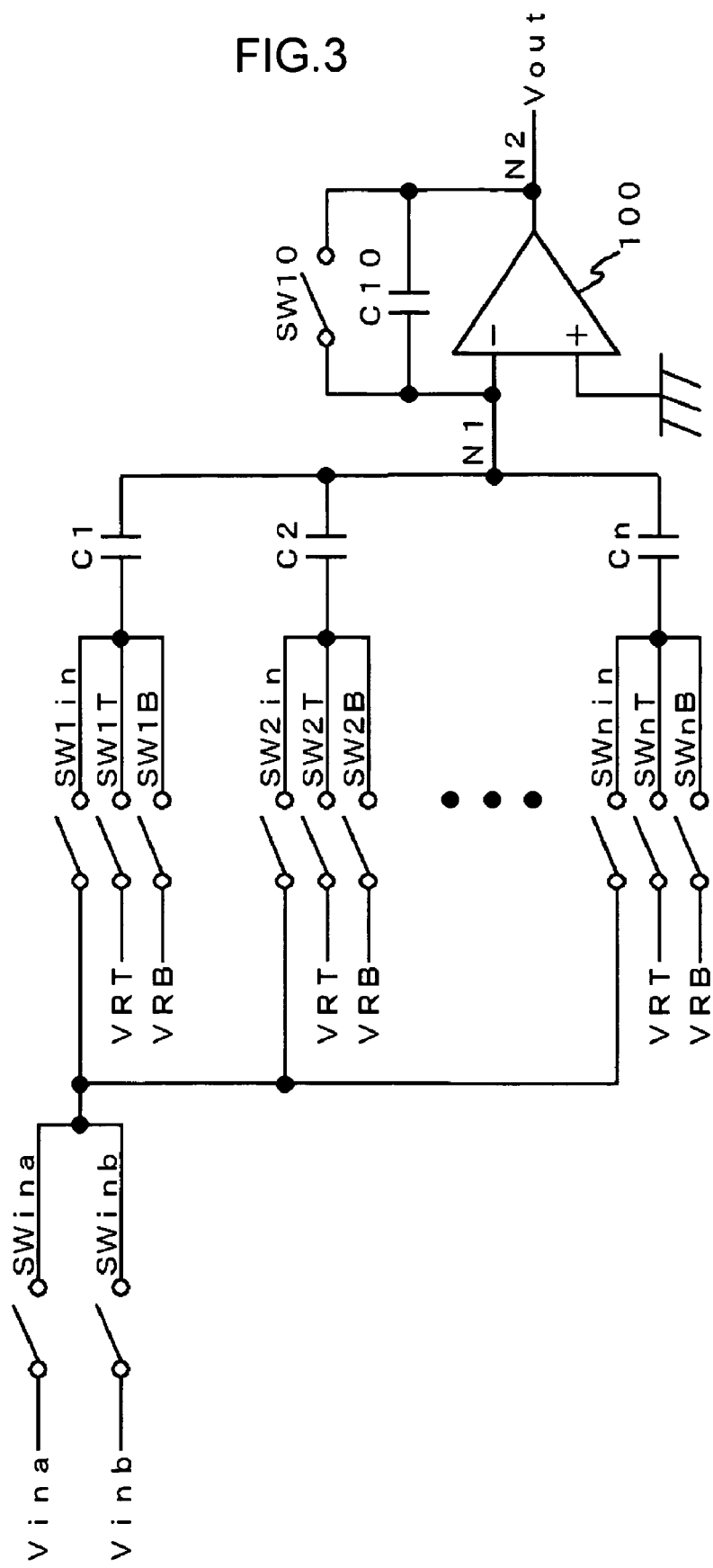
FIG. 3 illustrates a single-ended switched-capacitor type amplifier circuit as an example for comparison.

FIG. 3 illustrates a single-ended switched-capacitor type amplifier circuit as an example for comparison. As shown in FIG. 3, one or more input capacitors C1 to Cn are connected to an inverting input terminal of an operational amplifier 100. Connected to the respective input capacitors C1 to Cn are Vin switches SW1in to SWnin for on-off control of the input of an input signal Vin, which is selected from a plurality of input signals Vin, VRT switches SW1T to SWnT for on-off control of the input of a higher reference voltage VRT, and VRB switches SW1B to SWnB for on-off control of the input of a lower reference voltage VRB, respectively. Connected to the Vin switches SW1in to SWnin are a Vina switch SWina for on-off control of the input of an input signal Vina and a Vinb switch SWinb for on-off control of the input of another input signal Vinb. It is to be noted that the reference voltage to be used is not limited to two kinds but may be a single kind or three or more kinds.

A noninverting input terminal of the operational amplifier 100 is coupled to an autozero potential. An output terminal and the inverting input terminal of the operational amplifier 100 are coupled to each other via a feedback capacitor C10. Further connected outside thereof is an autozero switch SW10, realizing a structure which can short the output terminal and the inverting input terminal of the operational amplifier 100.

Figure 4:
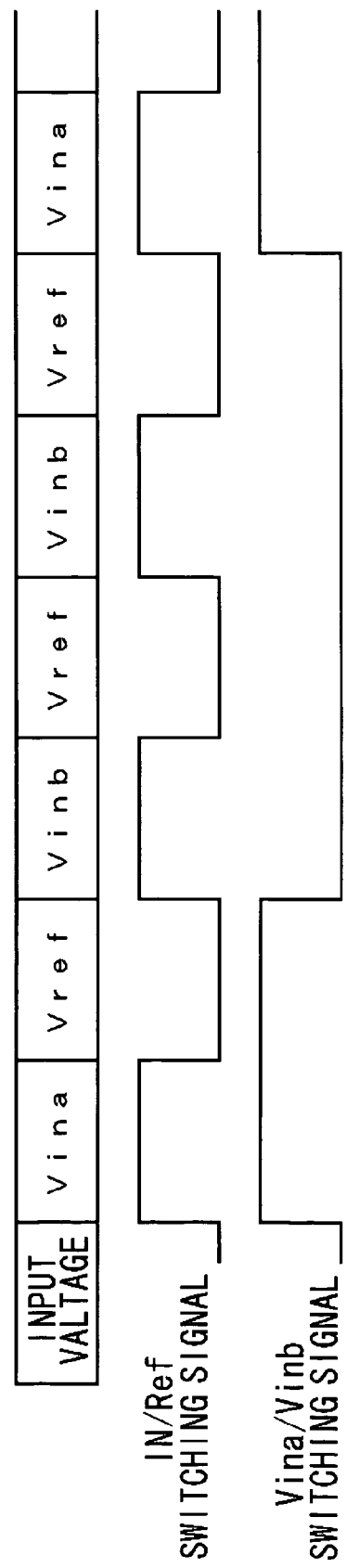
FIG. 4 is a timing chart showing the operation timing of the switches in the example for comparison.

Now referring to FIG. 4, a description is given of an operation of a single-ended switched-capacitor type amplifier circuit shown in FIG. 3. FIG. 4 is a timing chart showing the operation timing of the switches in the example for comparison. The Vin switches SW1in to SWnin, VRT switches SW1T to SWnT, VRB switches SW1B to SWnB and autozero switch SW10 are controlled on and off by an IN/Ref switching signal. The VRT switches SW1T to SWnT and VRB switches SW1B to SWnB turn on when the IN/Ref switching signal is low (Lo) and turn off when it is high (Hi). The Vin switches SW1in to SWnin and autozero switch SW10 turn on when the IN/Ref switching signal is high (Hi) and turn off when it is low (Lo).

The Vina switch SWina and the Vinb switch SWinb are controlled on and off by a Vina/Vinb switching signal. The Vina switch SWina turns on when the Vina/Vinb switching signal is high (Hi) and turns off when it is low (Lo). The Vinb switch SWinb turns on when the Vina/Vinb switching signal is low (Lo) and turns off when it is high (Hi). The operating principle of a switched-capacitor type amplifier circuit in the example for comparison is the same as that of a switched-capacitor type amplifier circuit according to the first embodiment.

As described above, the control signals for a switched-capacitor type amplifier circuit in the example for comparison are simpler than those for a switched-capacitor type amplifier circuit according to the first embodiment. Also, the structure thereof is such that an input signal Vin is sampled by input capacitors C1 to Cn via two switches, namely, a Vina switch SWina or Vinb switch SWinb and each of Vin switches SW1in to SWnin.

A lowpass filter is formed by the resistance component of these two switches and the capacitors. Accordingly, relative to an input signal Vin inputted to the Vina switch SWina or the Vinb switch SWinb, there occurs a delay in voltage change when the signal is inputted to the input capacitors C1 to Cn. To avoid this, delay, if the switches are to be structured with a CMOS (Complementary Metal Oxide Semiconductor) process, it may be necessary to use a larger gate width W to reduce the resistance component or use a smaller capacity of the capacitors to make the time constant smaller. However, a larger gate width W may result in an increase in the circuit area, and too small a capacity of the capacitors may present the problem of thermal noise.

In contrast to the above arrangement, a switched-capacitor type amplifier circuit according to the first embodiment is so structured that an input signal Vin is sampled by input capacitors C1 to Cn via a single switch, which is either a Vina switch SWina or a Vinb switch SWinb. This switched-capacitor type amplifier circuit structure, in contrast to that in the example for comparison, features a resistance component smaller by the loss of a switch and a smaller time constant of the aforementioned lowpass filter and hence a substantial reduction in the delay of voltage change as mentioned above.

Second Embodiment

A second embodiment of the present invention provides an example of an AD converter that outputs a total of 10 bits by converting 4 bits in the preceding stage of a noncyclic type and performing three cycles of 2-bit conversion in the subsequent stage of a cyclic type.

Figure 5:
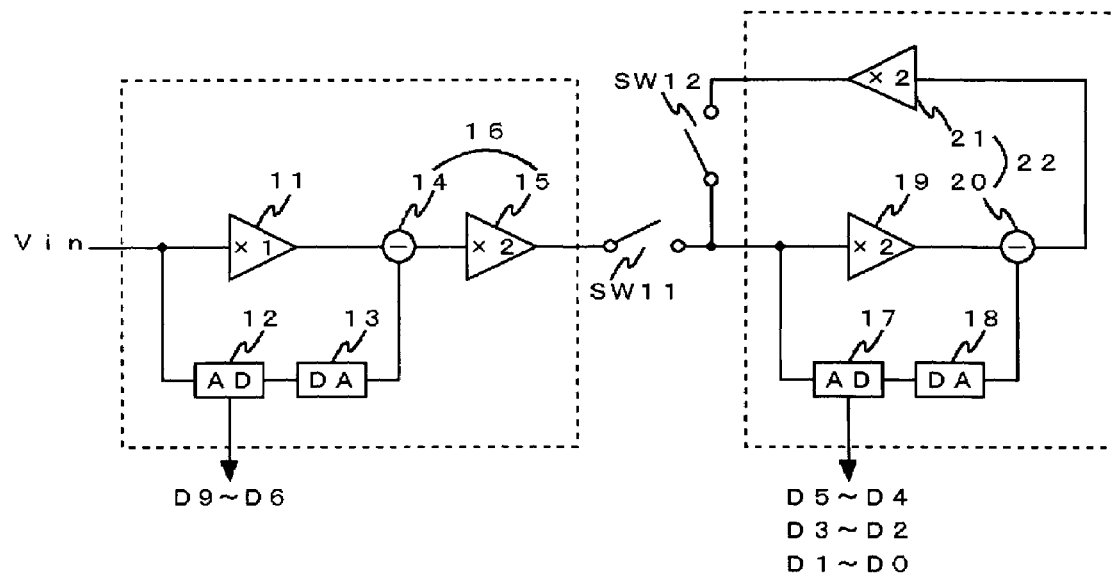
FIG. 5 illustrates a structure of an AD converter according to a second embodiment of the present invention.

FIG. 5 illustrates a structure of an AD converter according to the second embodiment. Firstly a description will be given of the preceding stage of this AD converter. An input analog signal Vin is inputted to a first amplifier circuit 11 and a first AD converter circuit 12. The first amplifier circuit 11 and the first AD converter circuit 12 sample the input analog signal Vin with the same timing. The first AD converter circuit 12 is a flash type whose resolution, or the number of bits to be converted, is 4 bits. The first AD converter circuits 12 converts the sampled analog signal Vin into a digital value, retrieves 4 higher-order bits (D9 to D6) and outputs them to an encoder (not shown) and a first DA converter circuit 13. The first DA converter circuit 13 converts the digital value converted by the first AD converter circuit 12 into an analog value.

The first amplifier circuit 11 holds the sampled input analog signal Vin for a predetermined period of time and outputs it to a first subtracter circuit 14 with a predetermined timing. The first amplifier circuit 11 does not amplify the analog signal but functions as a sample-and-hold circuit. The first subtracter circuit 14 subtracts the output of the first DA converter circuit 13 from the output of the first amplifier circuit 11. A second amplifier circuit 15 amplifies the output of the first subtracter circuit 14 by a factor of 2. It is to be noted that the first subtracter circuit 14 and the second amplifier circuit 15 may be an integrally structured first subtracter-amplifier circuit 16. By employing this structure, the circuit can be simplified.

Next, a description will be given of the subsequent stage. When a first switch SW1 is on and a second switch SW2 is off, an analog signal inputted from the preceding stage via the first switch SW1 is inputted to a third amplifier circuit 19 and a second AD converter circuit 17. The third amplifier circuit 19 and the second AD converter circuit 17 sample the analog signal with the same timing. The second AD converter circuit 17 is also a flash type whose resolution, or the number of bits including one redundant bit, is 3 bits. A reference voltage supplied to a voltage comparison element constituting the second AD converter circuit 17 is set to ½ of a reference voltage supplied to a voltage comparison element constituting the first AD converter circuit 12. The second AD converter circuits 17, which performs a 2-bit conversion, must amplify the analog signal after the conversion at the first AD converter circuit 12 practically by a factor of 4 (2 squared). However, since the gain of the second amplifier circuit 15 is 2, adjustment is made by the use of the ½ reference voltage. The second AD converter circuits 17 converts the sampled analog signal into a digital value, retrieves 5th and 6th higher-order bits (D5 and D4) and outputs them to an encoder (not shown) and a second DA converter circuit 18. The second DA converter circuit 18 converts the digital value converted by the second AD converter circuit 17 into an analog value.

The third amplifier circuit 19 amplifies the sampled analog signal by a factor of 2 and outputs the resulting signal to a second subtracter circuit 20. The second subtracter circuit 20 subtracts the output of the second DA converter circuit 18 from the output of the third amplifier circuit 19 and outputs this subtraction result to a fourth amplifier circuit 21. Here the output of the second DA converter circuit 18 is practically a result of amplification by a factor of 2. This can be realized by setting the ratio of the reference voltage range of the second AD converter circuit 17 to that of the second DA converter circuit 18 at 1:2. For example, the ratio of 1:2 can be set if a single input is made to the second AD converter circuit 17 and a differential output is made from the second DA converter circuit 18.

The fourth amplifier circuit 21 amplifies the output of the second subtracter circuit 20 by a factor of 2. At this stage, the first switch SW1 is off and the second switch SW2 is on. Thus the analog signal amplified at the fourth amplifier circuit 21 is fed back to the third amplifier circuit 19 and the second AD converter circuit 17 via the second switch SW2. It is to be noted that the second subtracter circuit 20 and the fourth amplifier circuit 21 may be formed as an integrally structured second subtracter-amplifier circuit 22. From here on, the above-described processing is repeated, and the second AD converter circuit 17 retrieves the 7th and 8th higher-order bits (D3 and D2) and the 9th and 10th higher-order bits (D1 and D0). In this fashion, a digital value composed of ten bits is obtained. The 5th to 10th higher-order bits are obtained in the subsequent stage of a cyclic type.

A switched-capacitor type amplifier circuit described in the above first embodiment can be used as the third amplifier circuit 19. That is, the input signal Vina and input signal Vinb shown in FIG. 1 may be corresponded to an output signal of the second amplifier circuit 15 and an output signal of the fourth amplifier circuit 21 shown in FIG. 5, respectively. And the Vina switches SW1a to SWna and the Vinb switches SW1b to SWnb shown in FIG. 1 may be corresponded to the first switch SW11 and the second switch 12 shown in FIG. 5, respectively. A predetermined reference voltage is being inputted during the amplification period of the third amplifier circuit 19.

In this manner, a switched-capacitor type structure of the first embodiment is employed in the third amplifier circuit 19, so that the delay of signals inputted to the third amplifier circuit 19 can be reduced. Thus, the subsequent stage can respond properly even if the output signals from the second amplifier circuit 15 and the fourth amplifier circuit 21 are faster, so that the operation speed of the second amplifier circuit 15 and the fourth amplifier circuit 21 can be raised. As a result, the high speed of the AD converter as a whole can be achieved.

Third Embodiment

A third embodiment of the present invention provides an example of an AD converter of a cyclic type where a total of 10 bits are outputted by first converting 4 bits and then performing three cycles of 2-bit conversion.

Figure 6:
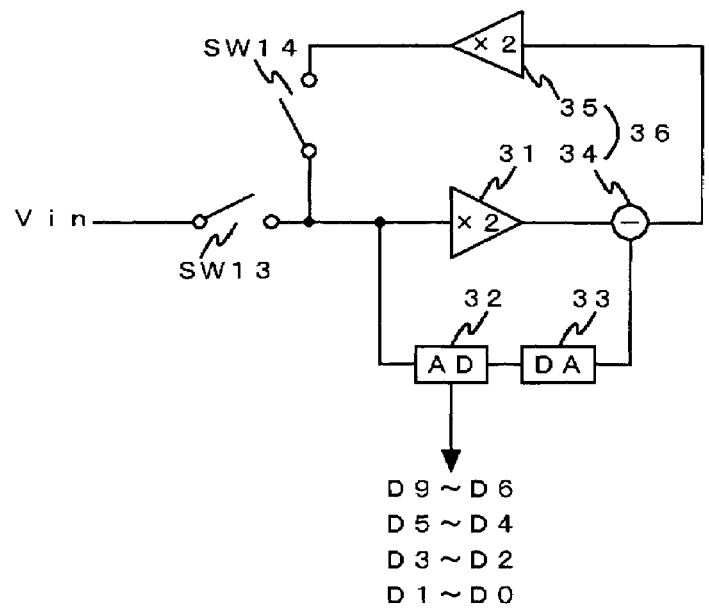
FIG. 6 illustrates a structure of an AD converter according to a third embodiment of the present invention.

FIG. 6 illustrates a structure of an AD converter according to the third embodiment. In an initial state, a first switch SW13 is on and a second switch SW14 is off. An input analog signal Vin is inputted to a first amplifier circuit 31 and an AD converter circuit 32 via the first switch SW3. The first amplifier circuit 31 and the AD amplifier circuit 32 sample the input analog signal Vin with the same timing. The AD converter circuit 32 is a flash type whose maximum resolution, or the number of bits to be converted, is 4 bits. The AD converter circuits 32 converts the sampled signal into a digital value, retrieves 4 higher-order bits (D9 to D6) and outputs them to an encoder (not shown) and a DA converter circuit 33. The DA converter circuit 33 converts the digital value converted by the AD converter circuit 32 into an analog value.

The first amplifier circuit 31 amplifies the sampled signal by a factor of 2 and outputs it to a subtracter circuit 34. The subtracter circuit 34 subtracts the output of the DA converter circuit 33 from the output of the first amplifier circuit 31. Here, the output of the DA converter circuit 33 at this point is practically a result of amplification by a factor of 2. This can be realized by setting the ratio of the reference voltage range of the AD converter circuit 32 to that of the DA converter circuit 33 at 1:2. A second amplifier circuit 35 amplifies the output of the subtracter circuit 34 by a factor of 2. It is to be noted here that the subtracter circuit 34 and the second amplifier circuit 35 may be an integrally structured subtracter-amplifier circuit 36. By employing this structure, the circuit can be simplified.

At this stage, the first switch SW13 is already off and the second switch SW14 is on. An output analog signal from the second amplifier circuit 35 is fed back to the first amplifier circuit 31 and the AD converter circuit 32 via the second switch SW14. The AD converter circuit 32 samples the analog signal inputted via the second switch SW14, performs thereon a conversion of 2 bits excluding 1 redundant bit, retrieves the 5th and 6th higher-order bits (D5 and D4) and outputs them to an encoder (not shown) and the DA converter circuit 33. The operation of the DA converter circuit 33, the first amplifier circuit 31, the subtracter circuit 34 and the second amplifier circuit 35 is the same as that for the conversion in the first cycle. Since the AD converter circuit 32 performs a 2-bit conversion from the second cycle onward, the first amplifier circuit 31 and the second amplifier circuit 35 perform a total amplification practically by a factor of 4 (2 squared). From here on, the above-described processing will be repeated, and the AD converter circuit 32 retrieves the 7th and 8th higher-order bits (D3 and D2) and the 9th and 10th higher-order bits (D1 and D0). In this fashion, a digital value composed of ten bits is obtained.

A switched-capacitor type amplifier circuit described in the above first embodiment can be used as the first amplifier circuit 31. That is, the input signal Vina and input signal Vinb shown in FIG. 1 may be corresponded to an input analog signal Vin and an output signal of the second amplifier circuit 35 shown in FIG. 6, respectively. And the Vina switches SW1$a$ to SWna and the Vinb switches SW1$b$ to SWnb shown in FIG. 1 may be corresponded to the first switch SW13 and the second switch 14 shown in FIG. 6, respectively. A predetermined reference voltage is being inputted during the amplification period of the first amplifier circuit 31.

In this manner, a switched-capacitor type structure of the first embodiment is employed in the first amplifier circuit 31, so that the delay of signals inputted to the first amplifier circuit 31 can be reduced. Thus, this AD converter can operate properly even if the input analog signal Vin and the output signal from the second amplifier circuit 35 are faster, so that the operation speed of the second amplifier circuit 35 can be raised. As a result, the high speed of the cyclic-type AD converter as a whole can be achieved.

Fourth Embodiment

A fourth embodiment of the present invention relates to a pipeline type AD converter composed of four stages, wherein 4 bits are converted by an AD converter circuit in the first stage and 2 bits each are converted by AD converter circuits in the second to fourth stages.

Figure 7:
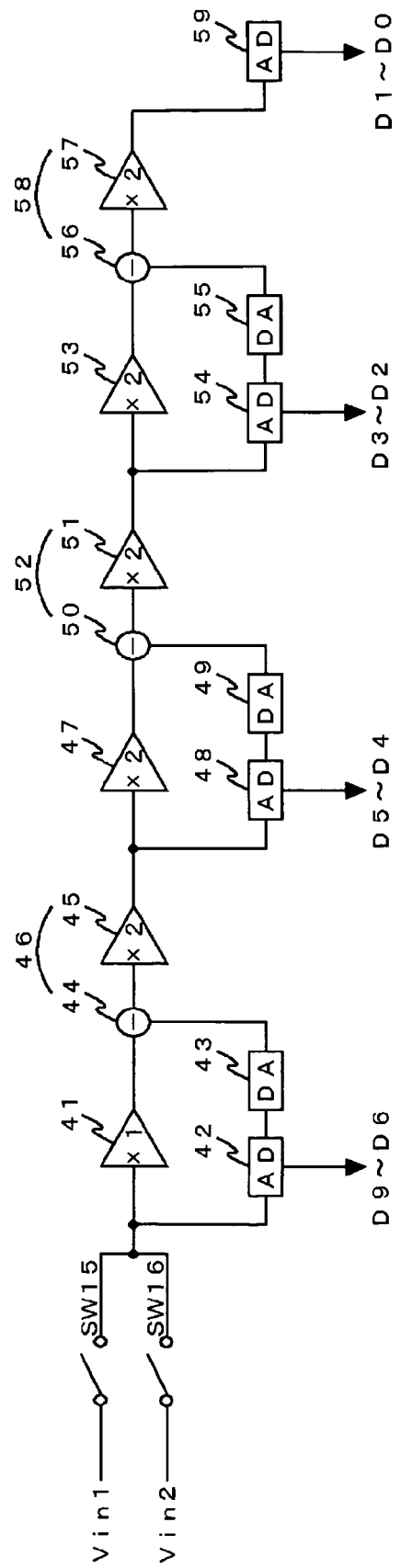
FIG. 7 illustrates a structure of an AD converter according to a fourth embodiment of the present invention.

FIG. 7 illustrates a structure of an AD converter according to the fourth embodiment. Two kinds of signals are inputted to this AD converter. A first switch SW15 performs an on-off control of the input of an input analog signal Vin1. A second switch SW16 performs an on-off control of the input of another input analog signal Vin2. The two kinds of input analog signals Vin1 and Vin2 are inputted selectively to a first amplifier circuit 41 and a first AD converter circuit 42. The first amplifier circuit 41 and the first AD converter circuit 42 sample an input signal with the same timing. The first AD converter circuit 42 is a flash type whose resolution, or the number of bits to be converted, is 4 bits. The first AD converter circuit 42 converts the sampled signal into a digital value and retrieves 4 higher-order bits (D9 to D6). A first DA converter circuit 43 converts the digital value outputted from the first AD converter circuit 42 into an analog value.

The first amplifier circuit 41 holds the sampled signal for a predetermined period and outputs it to a first subtracter circuit 44. The first amplifier circuit 41 does not amplify the sampled signal but functions as a sample-and-hold circuit. The first subtracter circuit 44 subtracts an output analog signal from the first DA converter circuit 43 from an output analog signal from the first amplifier circuit 41. A second amplifier circuit 45 amplifies the output analog signal from the first subtracter circuit 44 by a factor of 2. It is to be noted that the first subtracter circuit 44 and the second amplifier circuit 45 may be formed, instead, as an integrally structured first subtracter-amplifier circuit 46. In this way, the circuit area can be reduced.

An output analog signal from the second amplifier circuit 45 is inputted to a third amplifier circuit 47 and a second AD converter circuit 48. The third amplifier circuit 47 and the second AD converter circuit 48 sample the input signal with the same timing. The third amplifier circuit 47 amplifies the sampled signal by a factor of 2 and outputs it to a second subtracter circuit 50. The second AD converter circuit 48 converts the sampled signal into a digital value and retrieves the 5th and 6th higher-order bits (D5 and D4).

The number of bits to be converted in the second stage is 2 bits, and therefore it is necessary that the output of the first stage is practically a result of amplification by a factor of 4 (2 squared). Hence, an amplification by a factor of 2 is carried out by the second amplifier circuit 45 in the first stage. In addition thereto, if the reference voltage of a comparator in the second AD converter circuit 48 is set to ½ of that of the first AD converter circuit 42, then the above-mentioned amplification by a factor of 4 can be realized.

A second DA converter circuit 49 converts a digital value outputted from the second AD converter circuit 48 into an analog value. In doing so, the second DA converter circuit

49 amplifies the output of the second AD converter circuit 48 by a factor of 2. A second subtracter circuit 50 subtracts an output analog signal from the second DA converter circuit 49 from an output analog signal from the third amplifier circuit 47. A fourth amplifier circuit 51 amplifies an output analog signal from the second subtracter circuit 50 by a factor of 2. It is to be noted that the second subtracter circuit 50 and the fourth amplifier circuit 51 may be formed, instead, as an integrally structured second subtracter-amplifier circuit 52. In this way, the circuit area can be reduced.

An output analog signal from the fourth amplifier circuit 51 is inputted to a fifth amplifier circuit 53 and a third AD converter circuit 54. The fifth amplifier circuit 53 and the third AD converter circuit 54 sample the input signal with the same timing. The fifth amplifier circuit 53 amplifies the sampled signal by a factor of 2 and outputs it to a third subtracter circuit 56. The third AD converter circuit 54 converts the sampled signal into a digital value and retrieves the 7th and 8th higher-order bits (D3 and D2).

A third DA converter circuit 55 converts a digital value outputted from the third AD converter circuit 54 into an analog value. In doing so, the third DA converter circuit 55 amplifies the output of the third AD converter circuit 54 by a factor of 2. A third subtracter circuit 56 subtracts an output analog signal from the third DA converter circuit 55 from an output analog signal from the fifth amplifier circuit 53. A sixth amplifier circuit 57 amplifies an output analog signal from the third subtracter circuit 56 by a factor of 2. It is to be noted that an integrally structured third subtracter-amplifier circuit 58 may be used instead of the third subtracter circuit 56 and the sixth amplifier circuit 57.

An output analog signal from the sixth amplifier circuit 57 is inputted to a fourth AD converter circuit 59. The fourth AD converter circuit 59 samples the input analog signal and converts it into a digital value and retrieves the 9th and 10th higher-order bits (D1 and D0). In this manner, the ten bits of a digital value are obtained in four stages.

The first amplifier circuit 41 can employ a switched-capacitor type amplifier circuit as described in the first embodiment. That is, the input signal Vina and the input signal Vinb in FIG. 1 may be used as the input analog signal Vin1 and the input analog signal Vin2 in FIG. 7. And the Vina switches SW1a to SWna and the Vinb switches SW1b to SWnb in FIG. 1 may be used as the first switch SW15 and the second switch SW16 in FIG. 7. A predetermined reference voltage is inputted during the amplification period of the first amplifier circuit 41.

In this manner, by employing a structure of a switched-capacitor type amplifier circuit as described in the first embodiment for the first amplifier circuit 41, it is possible to reduce the delay of a signal inputted to the first amplifier circuit 41. Thus this structure can respond to the high speed of the input analog signal Vin1 and the input analog signal Vin2, which are inputted from outside. Accordingly, a pipeline-type AD converter as a whole can operate at high speed.

Figure 8:
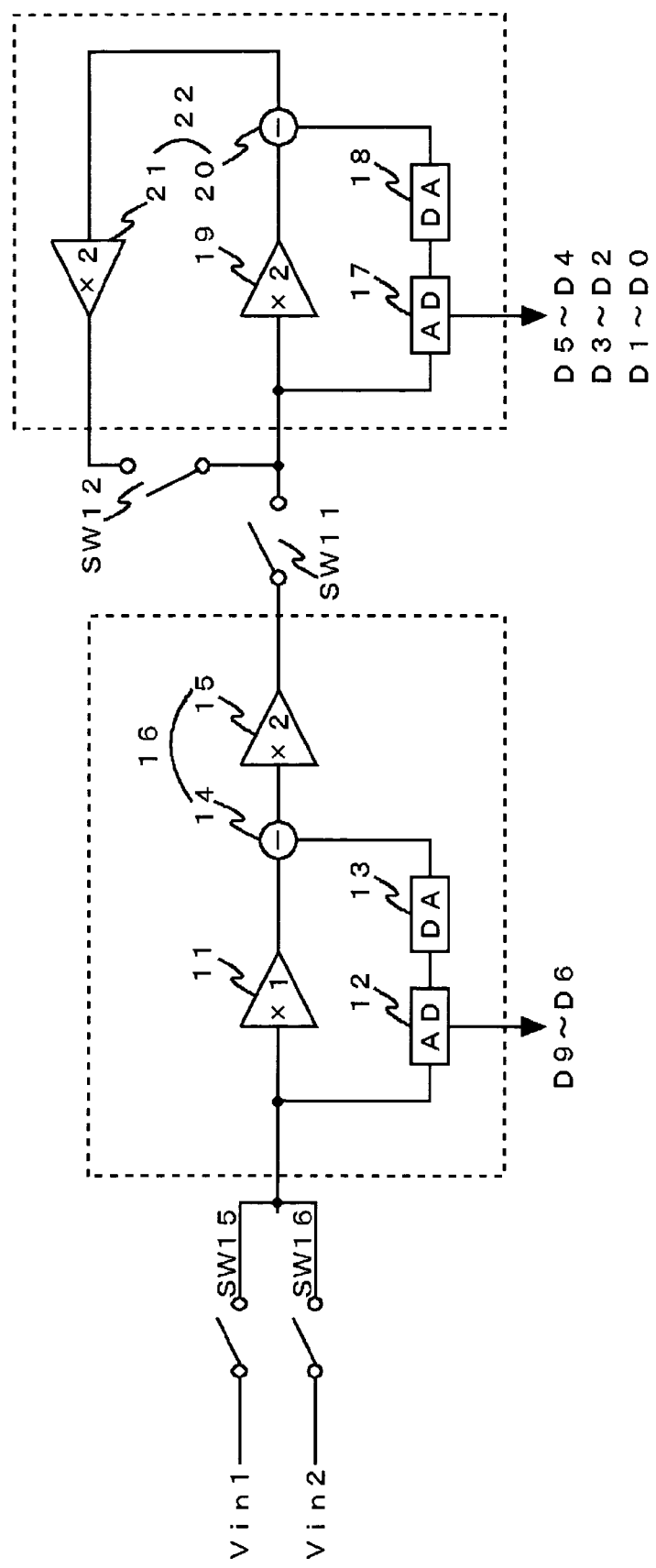
FIG. 8 illustrates a structure of an AD converter according to a modified example of the fourth embodiment.

A description will now be given of a modified example of the fourth embodiment of the present invention. FIG. 8 illustrates a structure of an AD converter according to a modified example of the fourth embodiment. The fourth embodiment represents a case wherein two kinds of signals are inputted to an AD converter according to the second embodiment. A first switch SW15 performs an on-off control of the input of an input analog signal Vin1. A second switch SW16 performs an on-off control of the input of another input analog signal Vin2. The two kinds of input analog signals Vin1 and Vin2 are inputted selectively to a first amplifier circuit 11 and a first AD converter circuit 12. Otherwise the description is identical to that of the second embodiment.

The first amplifier circuit 11 can employ a switched-capacitor type amplifier circuit as described in the first embodiment. That is, the input signal Vina and the input signal Vinb in FIG. 1 may be used as the input analog signal Vin1 and the input analog signal Vin2 in FIG. 8. And the Vina switches SW1a to SWna and the Vinb switches SW1b to SWnb in FIG. 1 may be used as the first switch SW15 and the second switch SW16 in FIG. 8. Also, a predetermined reference voltage is inputted during the amplification period of the first amplifier circuit 11.

In this manner, by implementing a structure of a switched-capacitor type amplifier circuit as described in the first embodiment into the first amplifier circuit 11, it is possible to reduce the delay of a signal inputted to the first amplifier circuit 11. Thus this structure can properly respond to the high speed of the input analog signal Vin1 and the input analog signal Vin2, which are inputted from outside. Accordingly, a pipeline-type AD converter as a whole, which includes a cyclic stage, can operate at high speed.

Fifth Embodiment

Figure 9:
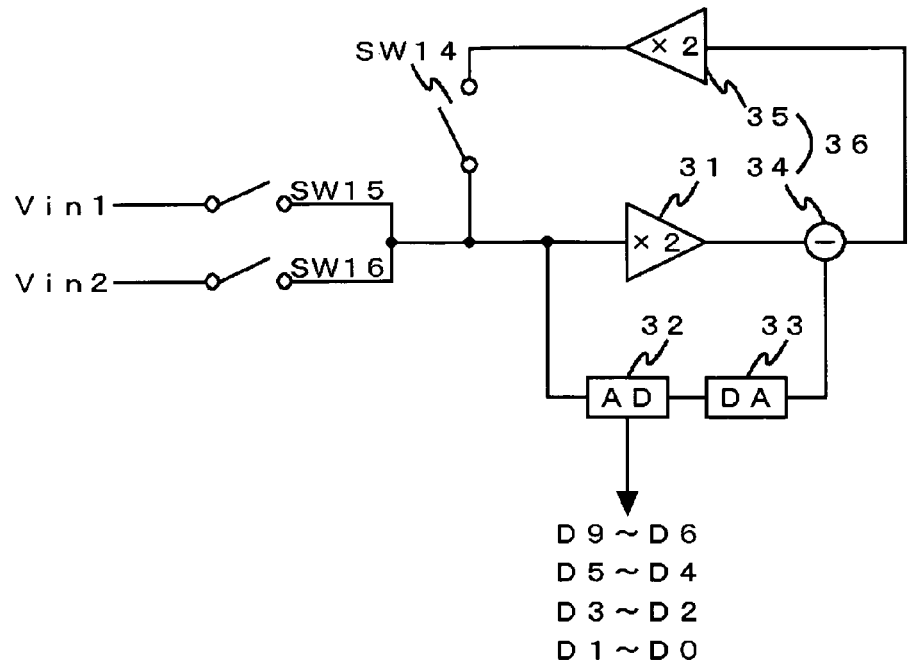
FIG. 9 illustrates a structure of an AD converter according to a fifth embodiment of the present invention.

FIG. 9 illustrates a structure of an AD converter according to a fifth embodiment of the present invention. The fifth embodiment provides an example where two kinds of signals are inputted to an AD converter of the third embodiment. A first switch SW15 performs an on-off control of the input of an input analog signal Vin1. A second switch SW16 performs an on-off control of the input of another input analog signal Vin2. The two kinds of input analog signals Vin1 and Vin2 are inputted selectively to a first amplifier circuit 31 and an AD converter 32. Otherwise the description is identical to that of the third embodiment.

A switched-capacitor type amplifier circuit described in the above first embodiment can be used as the first amplifier circuit 31. Though two kinds of input signals Vin1 and Vin2 are inputted through two switches SW15 and SW16 in the switched-capacitor type amplifier circuit shown in FIG. 1, three kinds of input signal may also be inputted. And it is easily understood and done by those skilled in the art by adapting the technique as shown in FIG. 11 that the switches performing an on-off control of these three kinds of input signals respectively are independently controlled. A predetermined reference voltage is being inputted during the amplification period of the first amplifier circuit 31.

In this manner, a switched-capacitor type structure of the first embodiment is employed in the first amplifier circuit 31, so that the delay of signals inputted to the first amplifier circuit 31 can be reduced. Thus this structure can respond to the high speed of the input analog signal Vin1 and the input analog signal Vin2, which are inputted from outside, as well as the output signal of the second amplifier circuit 35. Accordingly, an AD converter of a cyclic type, as a whole, that receives the input of plural kinds of input analog signals (e.g. Vin1 and Vin2) can operate at high speed.

Sixth Embodiment

A sixth embodiment of the present invention provides an example of an AD converter that outputs a total of 10 bits by converting 4 bits in the preceding stage of a noncyclic type and performing three cycles of 2-bit conversion in the subsequent stage of a cyclic type. And a structure according to this sixth embodiment is such that a DA converter circuit, a subtracter circuit and an amplifier circuit after subtraction are put to a common use in the preceding stage and the subsequent stage.

Figure 10:
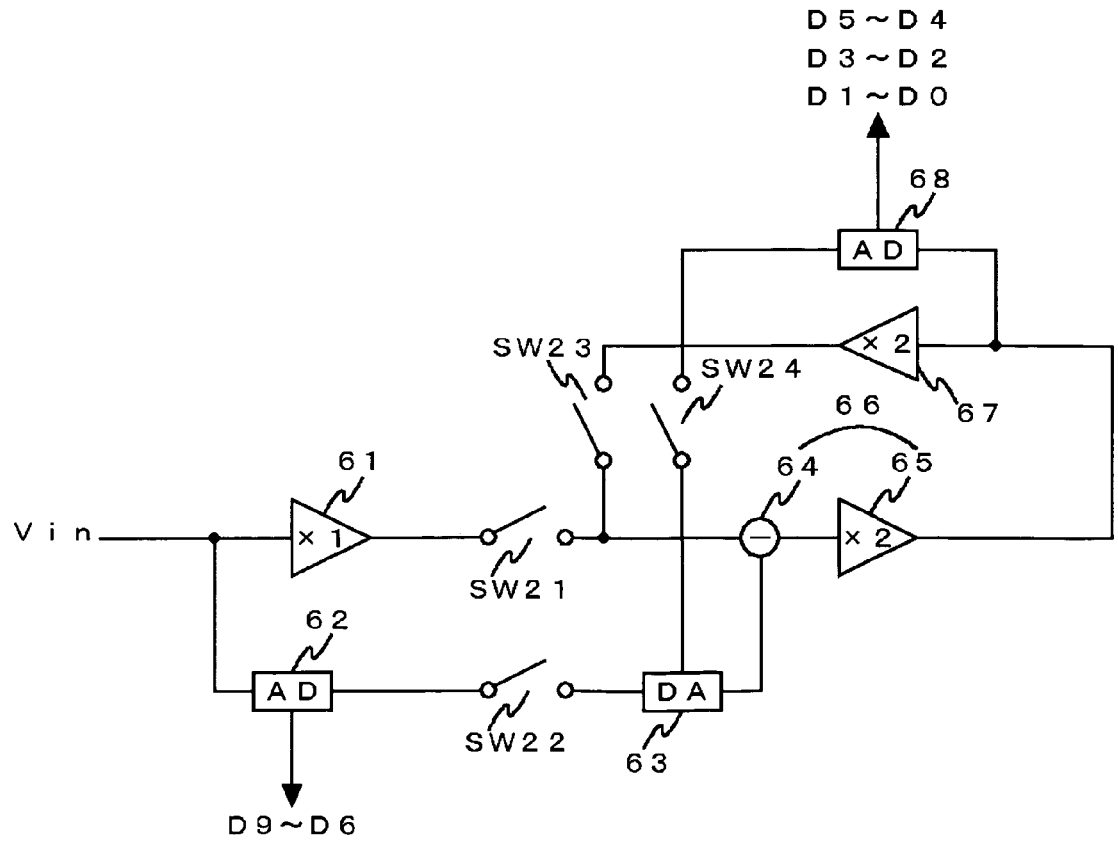
FIG. 10 illustrates a structure of an AD converter according to a sixth embodiment of the present invention.

FIG. 10 illustrates a structure of an AD converter according to the sixth embodiment. Firstly a description will be given of the preceding stage of this AD converter. An input analog signal Vin is inputted to a first amplifier circuit 11 and a first AD converter circuit 12. In an initial state, a first switch SW21 and a second switch SW22 are on and a third switch SW23 and a fourth switch SW24 are off. An input analog signal Vin is inputted to a first amplifier circuit 61 and an AD converter circuit 62. The first amplifier circuit 61 and the AD amplifier circuit 62 sample the input analog signal Vin with the same timing. The first AD converter circuit 62 is a flash type whose resolution, or the number of bits to be converted, is 4 bits. The first AD converter circuits 62 converts the sampled analog signal into a digital value, retrieves 4 higher-order bits (D9 to D6) and outputs them to an encoder (not shown) and a DA converter circuit 63. The DA converter circuit 63 converts the digital value converted by the first AD converter circuit 62 into an analog value.

The first amplifier circuit 61 holds the sampled input analog signal Vin for a predetermined period of time and outputs it to a subtracter circuit 64 with a predetermined timing via the first switch 21. The first amplifier circuit 61 does not amplify the analog signal but functions as a sample-and-hold circuit. The subtracter circuit 64 subtracts the output of the DA converter circuit 63 from the output of the first amplifier circuit 61. A second amplifier circuit 65 amplifies the output of the subtracter circuit 64 by a factor of 2. It is to be noted that the subtracter circuit 64 and the second amplifier circuit 65 may be an integrally structured subtracter-amplifier circuit 66. By employing this structure, the circuit can be simplified.

Next, a description will be given of the subsequent stage. The analog signal outputted from the second amplifier circuit 65 is inputted to a third amplifier circuit 67 and a second AD converter circuit 68. The third amplifier circuit 67 and the second AD converter circuit 68 sample the analog signal with the same timing. The second AD converter circuit 68 is also a flash type whose resolution, or the number of bits including one redundant bit, is 3 bits. A reference voltage supplied to a comparator constituting the second AD converter circuit 68 is set to ½ of a reference voltage supplied to a comparator constituting the first AD converter circuit 62. The second AD converter circuits 68, which performs a 2-bit conversion, must amplify the analog signal after the conversion at the first AD converter circuit 62 practically by a factor of 4 (2 squared). However, since the gain of the second amplifier circuit 15 is 2, adjustment is made by the use of the ½ reference voltage.

At this stage, the first switch SW21 and the second switch SW22 are off, and the third switch 23 and the fourth switch 24 are on. The second AD converter circuits 68 converts the sampled analog signal into a digital value, retrieves 5th and 6th higher-order bits (D5 and D4) and outputs them to an encoder (not shown) and the DA converter circuit 63 via the fourth switch SW24. The DA converter circuit 63 converts the digital value converted by the second AD converter circuit 68 into an analog value.

The third amplifier circuit 67 amplifies the sampled analog signal by a factor of 2 and outputs the resulting signal to the subtracter circuit 64. The subtracter circuit 64 subtracts the output of the DA converter circuit 63 from the output of the third amplifier circuit 67. Here the output of the DA converter circuit 63 is practically a result of amplification by a factor of 2. This can be realized by setting the ratio of the reference voltage range of the second AD converter circuit 68 to that of the DA converter circuit 63 at 1:2. For example, the ratio of 1:2 can be set if a single input is made to the second AD converter circuit 68 and a differential output is made from the DA converter circuit 63. In this manner, a structure and mechanism is required which controls whether or not to amplify the DA amplify circuit 63 by the cyclic operation.

The second amplifier circuit 65 amplifies the output of the subtracter circuit 64 by a factor of 2. The analog signal amplified by the second amplifier circuit 65 is fed to the third amplifier circuit 67 and the second AD converter circuit 68. From here on, the above-described processing is repeated, and the second AD converter circuit 68 retrieves the 7th and 8th higher-order bits (D3 and D2) and the 9th and 10th higher-order bits (D1 and D0). In this fashion, a digital value composed of ten bits is obtained. The 5th to 10th higher-order bits are obtained in the subsequent stage of a cyclic type.

A switched-capacitor type amplifier circuit described in the above first embodiment can be used as the subtracter-amplifier circuit 66. That is, the input signal Vina and input signal Vinb shown in FIG. 1 may be corresponded to an output signal of the first amplifier circuit 61 and an output signal of the third amplifier circuit 67 shown in FIG. 10, respectively. And the Vina switches SW1*a* to SWna and the Vinb switches SW1*b* to SWnb shown in FIG. 1 may be corresponded to the first switch SW21 and the third switch 23 shown in FIG. 10, respectively. The higher reference voltage VRT and the lower reference voltage VRB shown in FIG. 1 may be corresponded to an output signal of the DA converter circuit 63. If the DA amplifier circuit 63 is formed by a capacitive array type, the number of input capacitors C1 to Cn to which the higher reference voltage VRT and the lower reference voltage VRB are applied to is determined according to the output of the first AD converter circuit 62 or the second AD converter circuit 68.

In this manner, a switched-capacitor type structure of the first embodiment is employed in the subtracter-amplifier circuit 66, so that the delay of signals inputted to the subtracter-amplifier circuit 66 can be reduced. Thus, this structure can respond properly even if the output signals from the first amplifier circuit 61 and the third amplifier circuit 67 are faster, so that the operation speed of the first amplifier circuit 61 and the third amplifier circuit 67 can be raised. As a result, the present embodiment achieves the high speed of the AD converter as a whole as well as the reduction of circuit area.

The present invention has been described based on the embodiments which are only exemplary. The description of the exemplary embodiments is illustrative in nature and other various modifications to the combination of each component and process described above are possible. It is understood by those skilled in the art that such modifications are also within the scope of the present invention.

In the first embodiment, a single-ended switched-capacitor type amplifier circuit is described. And this single-ended switched-capacitor amplifier circuit is also applicable to a fully differential switched-capacitor type amplifier circuit. In such a case, the input capacitors C1 to Cn will be coupled to both the input terminals of the operational amplifier 100 in the first embodiment.

In the second embodiment, the first amplifier circuit 11 may be removed. If either the sampling time of the input analog signal Vin of the first subtracter-amplifier circuit 16 is adjusted or the input timing of the input analog signal Vin to the voltage comparison element constituting the first AD converter circuit 12 and the reference voltage is switched, then the operation of an AD converter as a whole can still be guaranteed even without the provision of the first amplifier circuit 11. In this modified example, the circuit area can be reduced. In the similar manner, the first amplifier circuit 41 in the third embodiment, the first amplifier circuit 11 in the modified example of the third embodiment and the first amplifier circuit 61 in the fifth embodiment may also be eliminated. Furthermore, the third amplifier circuit 47 and the fifth amplifier circuit 53 in the third embodiment may also be eliminated. In this case, the gain of the fourth amplifier circuit 51 and the sixth amplifier circuit 57 is preferably set to four times.

The bit number to be converted and the allocation thereof and parameters of gain in the amplifier circuits and so forth described in each of the above embodiments are only exemplary, and other values may be used for these parameters in modified examples. The number of stages is not limited to one or two stages, and the present invention is applicable to a case when the number of stages is three or more. And a structure may be such that one or more stages are of a cyclic type.

Although the present invention has been described by way of exemplary embodiments, it should be understood again that many other changes and substitutions may still further be made by those skilled in the art without departing from the scope of the present invention which is defined by the appended claims.

What is claimed is:

1. An analog-to-digital converter, including:
   an AD converter circuit which converts an input analog signal to a digital value of a predetermined bit number;
   a first amplifier circuit which samples the input analog signal and amplifies the sampled signal by a first predetermined gain; and
   a second amplifier circuit which amplifies, by a second predetermined gain, a difference between an analog signal outputted from said first amplifier circuit and an analog signal corresponding to the digital value amplified by a gain practically identical to the first predetermined gain, and which feeds the amplified difference back to said AD converter and said first amplifier circuit,
   wherein said first amplifier circuit includes an amplifier circuit of a capacitive coupling type in which any of the plurality of input signals is inputted to one end of capacitance and a voltage appearing on the other end is sampled, and the amplifier circuit of a capacitive coupling type includes: a plurality of switches for use with input signals, provided respectively at path through which the plurality of input signals lead to one end of the capacitance; and a switch for use with reference, provided at path through which a predetermined reference voltage signal leads to one end of the capacitance, wherein each of the switches for use with input signals is directly connected to one end of the capacitance.

2. An analog-to-digital converter according to claim 1, wherein a plurality of switches for use with a plurality of the input signals are respectively controlled by independent control signals.

3. An analog-to-digital converter according to claim 1, wherein a plurality of capacitors are connected in parallel to an input terminal of said first amplifier circuit.

4. An analog-to-digital converter according to claim 2, wherein a plurality of capacitors are connected in parallel to an input terminal of said first amplifier circuit.

5. An analog-to-digital circuit according to claim 1, in which an analog signal is converted to a digital signal in a plurality of stages, wherein an analog signal from a preceding stage in the plurality of stages and an analog signal from said second amplifier circuit are selectively inputted to said AD converter circuit and said first amplifier circuit.

6. An analog-to-digital circuit according to claim 2, in which an analog signal is converted to a digital signal in a plurality of stages, wherein an analog signal from a preceding stage in the plurality of stages and an analog signal from said second amplifier circuit are inputted selectively to said AD converter circuit and said first amplifier circuit.

7. An analog-to-digital converter, which converts an input analog signal to a digital signal in such a manner that the input analog signal is circulated a plurality of times, the analog-to-digital converter including:
   an AD converter circuit which converts the input analog signal to a digital value of a predetermined bit number;
   a first amplifier circuit which samples the input analog signal and amplifies the sampled signal by a first predetermined gain; and
   a second amplifier circuit which amplifies, by a second predetermined gain, a difference between an analog signal outputted from said first amplifier circuit and an analog signal corresponding to the digital value amplified by a gain practically identical to the first predetermined gain,
   wherein any of an plurality of the input analog signals is inputted to said AD converter circuit and said first amplifier circuit, and
   wherein said first amplifier circuit includes an amplifier circuit of a capacitive coupling type in which any of the plurality of input signals is inputted to one end of capacitance and a voltage appearing on the other end is sampled, and the amplifier circuit of a capacitive coupling type includes: a plurality of switches for use with input signals, provided respectively at path through which the plurality of input signals lead to one end of the capacitance; and a switch for use with reference, provided at path through which a predetermined reference voltage signal leads to one end of the capacitance, wherein each of the switches for use with input signals is directly connected to one end of the capacitance.

8. An analog-to-digital converter according to claim 7, wherein the plurality of switches for use with input signals are respectively controlled by independent control signals.

9. An analog-to-digital converter according to claim 7, wherein the capacitance is such that a plurality of capacitors are connected in parallel to an input terminal of said first amplifier circuit.

10. An analog-to-digital converter according to claim 8, wherein the capacitance is such that a plurality of capacitors are connected in parallel to an input terminal of said first amplifier circuit.

11. An analog-to-digital converter according to claim 7, wherein an analog signal outputted from said second amplifier circuit is further inputted to said AD converter circuit and said first amplifier circuit.

12. An analog-to-digital converter according to claim 8, wherein an analog signal outputted from said second amplifier circuit is further inputted to said AD converter circuit and said first amplifier circuit.

13. An analog-to-digital converter, in which an analog signal is converted to a digital signal in a plurality of stages, a stage of the analog-to-digital converter including:
   a shared DA converter circuit which selectively converts a converted digital value of own stage or that of another stage to an analog signal; and
   a shared subtracter-amplifier circuit which selectively performs subtraction between two subtractions where one subtraction is such that an output signal of said shared DA converter circuit is subtracted from the input analog signal of the own stage or an analog signal obtained after amplifying the input analog signal of the own stage by a predetermined gain and the other subtraction is such that an output signal of said shared DA converter circuit that has converted a converted digital value of the another stage is subtracted from the input analog signal of the another stage or an analog signal obtained after amplifying the input analog signal of the another stage by a predetermined gain, and which amplifiers a subtraction result by a predetermined gain, wherein said shared subtracter-amplifier circuit includes an amplifier circuit of a capacitive coupling type in which any of the plurality of input signals is inputted to one end of capacitance and a voltage appearing on the other end is sampled, and the amplifier circuit of a capacitive coupling type includes: a plurality of switches for use with input signals, provided respectively at path through which the plurality of input signals lead to one end of the capacitance; and a switch for use with reference, provided at path through which a predetermined reference voltage signal leads to one end of the capacitance, wherein each of the switches for use with input signals is directly connected to one end of the capacitance, and wherein the output signal of said shared DA converter circuit is inputted as the predetermined reference voltage signal.

14. An analog-to-digital converter according to claim 13, wherein the plurality of switches for use with input signals are respectively controlled by independent control signals.

15. An analog-to-digital converter according to claim 13, wherein the capacitance is such that a plurality of capacitors are connected in parallel to an input terminal of said subtracter-amplifier circuit.

16. An analog-to-digital converter according to claim 14, wherein the capacitance is such that a plurality of capacitors are connected in parallel to an input terminal of said subtracter-amplifier circuit.

* * * * *